United States Patent
Riegel et al.

(10) Patent No.: US 9,735,397 B2
(45) Date of Patent: Aug. 15, 2017

(54) RADIATION-EMITTING ORGANIC-ELECTRONIC DEVICE AND METHOD FOR THE PRODUCTION THEREOF

(75) Inventors: Nina Riegel, Tegernheim (DE); Jörg Frischeisen, Schwabmünchen (DE); Wolfgang Brütting, Augsburg (DE); Thomas Dobbertin, Regensburg (DE); Karsten Heuser, Erlangen (DE); Daniel Steffen Setz, Munich (DE); Benjamin Claus Krummacher, Regensburg (DE); Michael Flämmich, Jena (DE); Norbert Danz, Jena (DE)

(73) Assignees: OSRAM OLED GmbH (DE); Fraunhofer-Gesellschaft zur Förderung der angewandten Forschung e.V. (DE)

( * ) Notice: Subject to any disclaimer, the term of this patent is extended or adjusted under 35 U.S.C. 154(b) by 1004 days.

(21) Appl. No.: 13/994,953

(22) PCT Filed: Dec. 13, 2011

(86) PCT No.: PCT/EP2011/072632
§ 371 (c)(1),
(2), (4) Date: Sep. 18, 2013

(87) PCT Pub. No.: WO2012/080267
PCT Pub. Date: Jun. 21, 2012

(65) Prior Publication Data
US 2014/0014931 A1    Jan. 16, 2014

(30) Foreign Application Priority Data
Dec. 17, 2010    (DE) .................. 10 2010 054 893

(51) Int. Cl.
*H01L 51/00* (2006.01)
*H01L 51/56* (2006.01)
(Continued)

(52) U.S. Cl.
CPC .......... *H01L 51/56* (2013.01); *H01L 51/001* (2013.01); *H01L 51/0012* (2013.01);
(Continued)

(58) Field of Classification Search
CPC ................................................ H01L 51/0012
See application file for complete search history.

(56) References Cited

U.S. PATENT DOCUMENTS

| 7,282,586 B1 | 10/2007 | Yen et al. |
| 2005/0087131 A1 | 4/2005 | Shtein et al. |

(Continued)

FOREIGN PATENT DOCUMENTS

| CN | 1820061 | 8/2006 |
| CN | 101371377 A | 2/2009 |

(Continued)

OTHER PUBLICATIONS

Notification on Grant of Patent Right for Invention dated Nov. 5, 2015 of corresponding Chinese Application No. 201180060825.7 along with an English translation.
(Continued)

*Primary Examiner* — Robert Vetere
(74) *Attorney, Agent, or Firm* — DLA Piper LLP (US)

(57) ABSTRACT

A process of producing a radiation-emitting organic-electronic device having a first and a second electrode layer and an emitter layer includes: A) providing a phosphorescent emitter with an anisotropic molecule structure and a matrix material, B) applying the first electrode layer to a substrate, C) applying the emitter layer under thermodynamic control, with vaporization of the phosphorescent emitter and of the
(Continued)

matrix material under reduced pressure and deposition thereof on the first electrode layer such that molecules of the phosphorescent emitter are in anisotropic alignment, and D) applying the second electrode layer on the emitter layer.

16 Claims, 2 Drawing Sheets

(51) Int. Cl.
*H01L 51/50* (2006.01)
*H01L 51/52* (2006.01)

(52) U.S. Cl.
CPC ...... *H01L 51/0083* (2013.01); *H01L 51/0085* (2013.01); *H01L 51/5016* (2013.01); *H01L 51/5293* (2013.01)

(56) References Cited

U.S. PATENT DOCUMENTS

| | | | |
|---|---|---|---|
| 2006/0057750 A1* | 3/2006 | Aoki | H01L 27/1214 438/22 |
| 2007/0015004 A1 | 1/2007 | Nariyuki | |
| 2007/0104978 A1 | 5/2007 | Che et al. | |
| 2009/0218561 A1 | 9/2009 | Kitamura et al. | |
| 2009/0295276 A1 | 12/2009 | Asari et al. | |
| 2010/0108991 A1* | 5/2010 | Tanaka | C09K 11/06 257/40 |

FOREIGN PATENT DOCUMENTS

| | | |
|---|---|---|
| CN | 101427397 | 5/2009 |
| DE | 100 34 037 | 3/2001 |
| DE | 103 11 767 A1 | 9/2004 |
| EP | 1 486 552 A1 | 12/2004 |
| EP | 2 001 065 A1 | 12/2008 |
| JP | 2006-85933 | 3/2006 |
| JP | 2007-114244 A | 5/2007 |
| JP | 2007-154316 | 6/2007 |
| JP | 2009-55053 | 3/2009 |
| TW | 518908 B | 1/2003 |
| WO | 2007/114244 | 10/2007 |
| WO | 2010/112799 A1 | 10/2010 |

OTHER PUBLICATIONS

English translation of the corresponding Notice to File a Response of KR 10-2013-7018620 dated Dec. 29, 2014.
English translation of the Final Notification of Reasons for Refusal of corresponding Japanese Application No. 2013-543723 dated Feb. 16, 2015.
Flämmich, M. et al., "Oriented Phosphorescent emitters Boost OLED Efficiency," *Organic Electronics*, 2011, vol. 12, pp. 1663-1668.
Schmidt, T.D. et al., "Evidence for Non-Isotropic Emitter Orientation in a Red Phosphorescent Organic Light-Emitting Diode and its Implications for Determining the Emitter's Radiative Quantum Efficiency," *Applied Physics Letter*, 2011, vol. 99, pp. 163302.
Frischeisen, J. et al., "Light Extracting in Organic Light-Emitting Diodes," *Universität Augsburg*, 2011, complete book.
English and German translations of an Office Action dated Apr. 3, 2015 of corresponding Chinese Application No. 201180060825.7.
English translation of corresponding Notification of Reasons for Refusal dispatched Apr. 28, 2014 from corresponding Japanese Application No. 2013-543723.
Danz, N., et al., "Dipole lifetime in stratified media," J. Opt. Soc. Am., B/vol. 19, No. 3, Mar. 2002, pp. 412-419.
Flämmich, M., et al., "Orientation of emissive dipoles in OLEDS: Quantitative in situ analysis," Organic Electronics, vol. 11, 2010, pp. 1039-1046.
Frischeisen. J., et al., "Determination of molecular dipole orientation in doped fluorescent organic thin films by photoluminescence measurements," Applied Physics Letters, vol. 96, 073302, 2010.
Krummacher, B C., et al., "Efficiency analysis of organic light-emitting diodes based on optical simulation," Organic Electronics, vol. 10, 2009, pp. 478-485.

\* cited by examiner

RADIATION-EMITTING ORGANIC-ELECTRONIC DEVICE AND METHOD FOR THE PRODUCTION THEREOF

TECHNICAL FIELD

This disclosure relates to a process of producing a radiation-emitting organic electronic device with improved efficiency in which an emitter layer of the organic electronic device is formed from materials having anisotropic molecular structure under thermodynamic control. The disclosure further relates to a radiation-emitting organic electronic device producible by this process.

BACKGROUND

In radiation-emitting organic electronic devices, especially in organic light-emitting diodes (OLEDs), the radiation generated is only partly emitted directly. The following loss channels have been observed: wave-guiding effects of the transparent substrate (arranged in the beam path of the emitted radiation), wave-guiding effects in the organic layers and the transparent electrode (arranged in the beam path of the emitted radiation), absorption losses (because of the materials through which emitted radiation passes) and the formation of surface plasmons, especially at a metallic electrode (for example, the cathode).

It could therefore be helpful to provide a process and a radiation-emitting organic electronic device produced thereby, in which the efficiency is improved and, more particularly, the losses through at least one of the loss channels mentioned are reduced.

SUMMARY

We provide a process of producing a radiation-emitting organic electronic device having a first and a second electrode layer and an emitter layer, including A) providing a phosphorescent emitter with an anisotropic molecular structure and a matrix material, B) applying the first electrode layer to a substrate, C) applying the emitter layer under thermodynamic control, with vaporization of the phosphorescent emitter and of the matrix material under reduced pressure and deposition thereof on the first electrode layer such that molecules of the phosphorescent emitter are in anisotropic alignment, and D) applying the second electrode layer on the emitter layer.

We also provide a radiation-emitting organic electronic device obtained by the process of producing a radiation-emitting organic electronic device having a first and a second electrode layer and an emitter layer, including A) providing a phosphorescent emitter with an anisotropic molecular structure and a matrix material, B) applying the first electrode layer to a substrate, C) applying the emitter layer under thermodynamic control, with vaporization of the phosphorescent emitter and of the matrix material under reduced pressure and deposition thereof on the first electrode layer, such that molecules of the phosphorescent emitter are in anisotropic alignment, and D) applying the second electrode layer on the emitter layer.

We further provide the radiation-emitting organic electronic device, including a substrate, a first electrode layer on the substrate, an emitter layer on the first electrode layer, which includes a phosphorescent emitter and a matrix material, wherein molecules of the phosphorescent emitter are in anisotropic alignment and as the phosphorescent emitter an iridium complex of the following formula is selected:

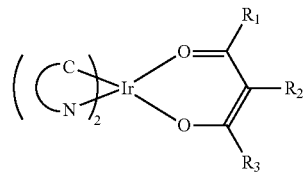

where C∩N is an at least bidentate ligand which forms a metallacyclic ring with the Ir atom, and where $R_1$, $R_2$ and $R_3$ are each independently unbranched or branched alkyl radicals, fused and/or cyclic alkyl radicals and/or aryl radicals, each of which may be fully or partly substituted, and where $R_2$ may also be H or F and wherein the ligand C∩N is phenyloxazole, benzylpyridine, benzylimidazole, benzyloxazole or a ligand which has one of the compounds mentioned as a base skeleton.

We still further provide a process of producing a radiation-emitting organic electronic device having a first and a second electrode layer and an emitter layer, including A) providing a phosphorescent emitter with an anisotropic molecular structure and a matrix material, B) applying the first electrode layer to a substrate, C) applying the emitter layer under thermodynamic control, with vaporization of the phosphorescent emitter and of the matrix material under reduced pressure and deposition thereof on the first electrode layer, such that molecules of the phosphorescent emitter are in anisotropic alignment, wherein the thermodynamic control is effected by bringing the deposited emitter layer to an elevated temperature relative to room temperature or keeping it at such a temperature after and/or during the deposition step, and D) applying the second electrode layer on the emitter layer.

DETAILED DESCRIPTION

Figure 1:
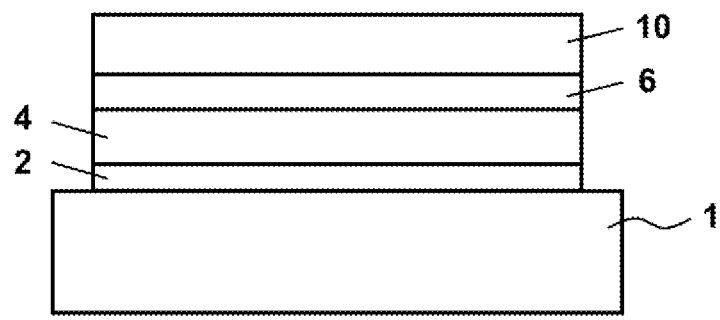
FIGS. 1 and 2 each show a schematic diagram of a radiation-emitting component.

We provide a process of producing a radiation-emitting organic electronic device that may comprise:

A) a phosphorescent emitter having an anisotropic molecular structure and a matrix material are provided;

B) a first electrode layer is applied to a substrate;

C) an emitter layer is applied on the first electrode layer under thermodynamic control, with vaporization of the phosphorescent emitter and of the matrix material under reduced pressure and deposition thereof on the electrode layer; in this context, the thermodynamic control results in an anisotropic alignment of the molecules of the phosphorescent emitter; and D) a second electrode layer is applied on the emitter layer.

An anisotropic molecular structure is understood to mean that the molecules used do not form an essentially spherical molecular structure, but rather an elongated molecular structure. To achieve this, the phosphorescent emitters especially have at least two kinds of different ligands (especially ligands which differ with regard to their atoms coordinating to the central atom) or have a square-planar environment of the central atom.

A first layer arranged or applied "on" a second layer may mean that the first layer has been arranged or applied directly in direct mechanical and/or electrical contact on the second layer. In addition, indirect contact may also be referred to, in which further layers are arranged between the first layer and the second layer.

Application under thermodynamic control is understood to mean that, in the course of deposition of the emitter molecules and of the molecules of the matrix material, there is no random alignment of the molecules deposited, and the alignment instead takes place at least partly in a preferential direction. In combination with this, the transition dipole moments of the emitter molecules also have an overall anisotropic distribution within the matrix characterized particularly in that more transition dipole moments are arranged parallel to the layer plane of the emitter layer than transition dipole moments aligned orthogonally thereto. The transition dipole moments have a particular orientation in the emitting molecule and are relevant because the emission process is a dipole transition. Thermodynamic control thus requires that, in contrast to the case of kinetic control, an emitter molecule is not automatically "frozen" in the position in which it first interacts with the surface on which it is deposited. Instead, a reorientation may occur during the deposition or in a later step, in which adjacent molecules are aligned, and a more thermodynamically favorable configuration can be adopted. Such an anisotropic alignment of the emitter molecules is possible especially when starting materials having an anisotropic molecular structure are selected both for the emitter and for the matrix material.

We discovered that the starting materials having anisotropic molecular structure enable production of emitter layers in which the individual emitter molecules and, hence, also the transition dipole moments of the emitting molecules have a preferential alignment. In the ideal case, the emitter molecules are aligned essentially in parallel, in which case it is observed that almost no loss occurs as a result of plasmons. The loss channel of "efficiency loss through plasmon emission" is thus partly blocked. Thus, the overall efficiency ultimately rises significantly. As a result of the essential presence of a preferential alignment of the emitter molecules, which are preferably aligned parallel to the substrate surface, there may be a restricted degree of interaction of the electromagnetic field which arises in the recombination of the electron and hole with the plasmons of the metal layer.

A plasmon is understood to mean a charge carrier density fluctuation in the metal layer of the first electrode.

More particularly, an electromagnetic field produced by a recombinant exciton can induce free charge carriers, especially electrons, in the metal layer of an electrode to undergo charge carrier density fluctuations. In other words, the electromagnetic field which arises in the recombination of an exciton can couple to a plasmon in the metal layer of the electrode such that the recombination energy can be transferred at least partly to the plasmon.

More particularly, plasmons (to be exact: surface plasmons) refer here to longitudinal charge carrier density fluctuations which occur in parallel to the plane over which a surface of the metal layer of an electrode extends over this surface. Surface plasmons can be produced particularly at the surface of the metal layer of this electrode facing the emitter layer.

The process may include thermodynamic control in step C) effected by selecting a growth rate less than or equal to 0.5 nm/s. More particularly, the growth rate may be less than 0.2 nm/s and is frequently also less than 0.1 nm/s. The growth rate is often less than 0.05 nm/s. It may, for example, also be less than 0.025 nm/s. In the case of a growth rate of 0.05 nm/s, the deposition time for an emitter layer of thickness 10 nm is then about 200 s. The growth rate is understood to mean the rate at which the emitter layer is deposited on the first electrode layer in step C). In general, the amount of material deposited is, for example, essentially identical with the amount of material vaporized from a reservoir.

A particularly slow growth rate can be selected, for example, when the materials for the emitter layer do not permit an elevated temperature of the substrate to be coated (see example below).

The thermodynamic control in step C) may be achieved by subjecting the deposited layer (particularly prior to the deposition of further layers) to a thermal treatment after and/or during the deposition step (step C)). The emitter layer may especially be brought to an elevated temperature relative to room temperature or kept at such a temperature. Thus, elevated temperatures may either act on the deposited layer during the deposition and/or the deposited layer can be heat-treated after complete deposition of the emitter layer (and prior to deposition of a further layer). In the case of such a thermal treatment, the layer is thus converted to a state in which reorientation, especially of the emitter molecules, is possible such that the emitter molecules can be aligned. This aligned state can subsequently be frozen by the cooling. The thermal treatment here can especially be effected by heating the emitter layer or the layer adjoining the substrate (for example, by a heated substrate). The emitter layer can be brought, for example, to a temperature of 30° C. to 100° C. It is essential here that the temperatures selected do not cause any damage to the layers of the organic electronic device to be applied or already applied.

According to the application, the selection of the matrix molecules and of the emitter molecules can thus be made particularly such that no further reorientation of the emitter molecules is possible at room temperature (for example, through isomerizations of the ligands of the phosphorescent emitter).

The thermodynamic control can also be effected both by selecting a slow growth rate (as described above) and by subjecting the emitter layer to a thermal treatment.

In step A), the phosphorescent emitter having anisotropic molecular structure may be selected from iridium complexes, platinum complexes and palladium complexes, or from mixtures thereof. The iridium complexes in particular give very good quantum yields when they are used as emitter molecules in organic radiation-emitting devices. However, platinum and palladium complexes also give very good results since they can be deposited very easily to give molecular arrangements aligned essentially in parallel to one another and to the substrate surface owing to the usually square-planar coordination in the presence of an appropriate matrix material. Generally, the phosphorescent emitters, however, are not restricted to these metal complexes. Instead, other metal complexes are also suitable in principle such as lanthanoid complexes (for example europium complexes), or else gold, rhenium, rhodium, ruthenium, osmium or zinc complexes.

The iridium complexes selected in accordance with the application may especially be complexes of the following formula:

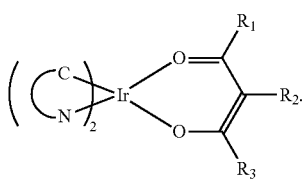

In this formula, C∩N is an at least bidentate ligand which forms a metallacyclic ring with the metal atom. The expression "C∩N" additionally represents a ligand in which coordination to the iridium atom is effected first via a carbon atom and second via a nitrogen atom. Both the carbon atom and the nitrogen atom are typically in an aromatic ring system. In the case of the carbon atom, this is usually a homocyclic aromatic ring. Independently, the ring coordinated to the iridium atom via the nitrogen atom is typically a heterocyclic ring which, apart from the nitrogen atom, does not contain any further heteroatom or contains only one further heteroatom (especially a further nitrogen atom or an oxygen atom).

The two C∩N ligands here may together also form a tetradentate ligand. Bridge formation of the other ligand (an acetylacetonate derivative) with one or both of the C∩N ligands is likewise possible. In the acetylacetonate derivative, the R1, R2 and R3 radicals are each independently branched, unbranched, fused and/or cyclic alkyl radicals and/or aryl radicals. The derivative may especially be acetylacetonate itself. Both the aryl radicals and the alkyl radicals may be substituted fully or partly by functional groups (for example, ether groups (for instance methoxy, ethoxy or propoxy groups), ester groups, amide groups or else carbonate groups). The R2 radical may also be hydrogen or fluorine. Frequently, the R1 and R2 radicals will be methyl, ethyl or propyl and optionally also phenyl. R2 will frequently be hydrogen or fluorine. The ethyl, methyl, propyl and phenyl groups mentioned are either unsubstituted or have one or more fluorine substituents. The latter compounds are easy to obtain synthetically or commercially available. The introduction of fluorine substituents generally facilitates the vaporizability of the complexes with such ligands and additionally leads frequently to a shift in the emission to shorter wavelengths.

The ligand C∩N may form a five-membered or six-membered metallacyclic ring with the iridium atom. More particularly, the ligand C∩N may be phenylpyridine, phenylimidazole, phenyloxazole, benzylpyridine, benzylimidazole or benzyloxazole, or a ligand which has one of the compounds mentioned as a base skeleton, i.e., the corresponding heterocyclic base structure is present, but in which additional substituents, bridges or fused rings are present. Possible substituents include especially fluorine atoms, since substitution by one or more fluorine atoms can achieve a shift in the emission wavelength into the blue spectral range (430-500 nm) or even the violet spectral range (380-430 nm). In addition, substituents present for branched, unbranched, fused and/or cyclic alkyl radicals and/or aryl radicals may be functional groups (for example ether groups (for instance methoxy, ethoxy or propoxy groups), ester groups, amide groups or else carbonate groups).

With the ligands mentioned above, it is often possible to achieve particularly large transition dipole moments.

The ligand C∩N may have at least three at least partly fused aromatic rings. Frequently, the ligand will even have four or more at least partly fused aromatic rings. "At least partly fused" here means that one or else more than one fused ring system may be present in the ligand C∩N. For example, the ligand may be formed by three aromatic rings fused to one another, to which a phenyl group or a benzyl group is bonded. If more than one ring system is present in the ligand, the fused aromatic ring may be fused either to the nitrogen heterocycle or to the homocyclic aromatic system, or else to both rings.

Useful emitter materials include especially the following compounds which have an emission maximum in the blue, green or red spectral range:

Ir(ppy)$_2$(acac)=(bis(2-phenylpyridine)(acetylacetonate) iridium(II)), Ir(mppy)$_2$(acac)=(bis[2-(p-tolyl)pyridine] acetylacetonate)iridium(III)), bis[1-(9,9-dimethyl-9H-fluoren-2-yl)isoquinoline](acetylacetonate)iridium (III), Ir(mdq)$_2$(acac)=(bis(2-methyldibenzo[f,h]-quinoxaline)(acetylacetonate)iridium(III)), iridium(III) bis(dibenzo[f,h]quinoxaline)-(acetylacetonate), Ir(btp)$_2$(acac)=(bis(2-benzo[b]thiophen-2-ylpyridine) (acetylacetonate)iridium(III)), Ir(piq)$_2$(acac)=(bis(1-phenylisoquinoline)(acetylacetonate)iridium(III)), Ir(fliq)$_2$(acac)-1=(bis[1-(9,9-dimethyl-9H-fluoren-2-yl)isoquinoline](acetylacetonate)iridium(III)), hex-Ir(phq)$_2$(acac)=bis[2-(4-n-hexylphenyl)quinoline] (acetylacetonate)iridium(III), Ir(flq)$_2$(acac)$_2$=(bis[3-(9,9-dimethyl-9H-fluoren-2-yl)isoquinoline] (acetylacetonate)iridium(III)), bis[2-(9,9-dibutylfluorenyl)-1-isoquinoline](acetylacetonate) iridium(III), bis[2-(9,9-dihexylfluorenyl)-1-pyridine] (acetylacetonate)iridium(III), (fbi)$_2$Ir(acac)=bis(2-(9,9-diethylfluoren-2-yl)-1-phenyl-1H-benzo[d] imidazolato)(acetylacetonate)iridium(III), Ir(2-phq)$_2$ (acac)=(bis(2-phenylquinoline)(acetylacetonate) iridium(III)), iridium(III)-bis(2-(2'-benzothienyl) pyridinato-N,C3')(acetylacetonate), Ir(BT)$_2$(acac)=bis (2-phenylbenzothiazolate)(acetylacetonate)iridium (III), (PQ)$_2$Ir(dpm)=bis(2-phenylquinoline)(2,2,6,6-tetramethylheptane-3,5-dionate)iridium(III), (Piq)$_2$Ir (dpm)=bis(phenylisoquinoline)(2,2,6,6-tetramethylheptane-3,5-dionate)iridium(III) and iridium(III) bis(4-phenylthieno[3,2-c]pyridinato-N, C2')acetylacetonate and mixtures of the aforementioned substances. For emitter materials which emit in the blue wavelength range, carbene complexes of iridium, for example, are an option. The symbol "C∩N" in that case thus represents a ligand in which coordination to the iridium atom is effected via a carbene carbon atom and a nitrogen atom.

As well as the phosphorescent metal complex, the matrix material may also have an anisotropic molecular structure. With such matrix materials, anisotropic alignment of the phosphorescent metal complexes can additionally be promoted.

In a corresponding manner to the anisotropic phosphorescent metal complexes, it is also the case for the matrix material having anisotropic molecular structure that, in particular, no essentially symmetrically substituted linkage points may be present here, for instance an aromatic six-membered ring (symmetrically) substituted in positions one, three and five, or a tertiary amine having three identical substituents in each case.

More particularly, a matrix material having anisotropic molecular structure is understood to mean a material in which, proceeding from a central branching site, especially a central atom or a central ring, no three, four or more substituents are present with identical or essentially identical structure (considering only non-hydrogen substituents). An identical structure means that the substituents are identical.

An essentially identical structure additionally means that the at least three substituents are different with respect to the molecular weight that they account for, but that a molecular weight at least 50% below one of the other substituents is not present in any of the substituents of the branching site (considering only non-hydrogen substituents). Accordingly, molecules having anisotropic molecular structure are not highly symmetric molecules having more than two identical substituents, or they have very different substituents in the case of branching sites having three or more substituents (for example, branching sites such as tertiary amine nitrogen atoms or at least trisubstituted benzene rings).

The above-defined branching site is especially the branching site closest to the center of the molecule. Owing to possible rotations of partial regions of the molecule, the center of the molecule is difficult to determine. However, it is completely clear to those skilled in the art in most molecules without calculation which branching site in a molecule is closest to the center since the center that would arise if all atoms were assumed to indeed be arranged merely two-dimensionally in the plane of the paper is also sufficient as an approximation for the determination.

The matrix material in step A) may be selected from compounds of the A-K-B type.

In this formula, the structural element K represents an Ar1—X—Ar2 structure which is especially catenated. In this structure, Ar1 and Ar2 are identical or different aromatic rings and X is a single bond, a further aromatic group or a linkage (of Ar1 and Ar2) by a fused (or condensed) ring, i.e., of a ring by which the two radicals Ar1 and Ar2 are fused to one another.

In addition, the structural elements A and B are also the same or different and each comprise at least one aromatic ring, especially an aromatic ring which is bonded directly or indirectly (i.e., linked via further atoms or groups) to the structural element K.

The Ar1, Ar2 and X (if it is an aromatic group) groups may be aromatic compounds which are unsubstituted or have any substitution. More particularly, the substituents, however, are selected from groups with low steric demands. In general, the aromatic Ar1, Ar2 and X rings will therefore not have any substituents whose carbon atoms do not necessarily come to rest in the plane formed by the aromatic ring, and usually also no substituents which at least partly (in terms of space and/or time) do not lie in the plane formed by the aromatic. The same also applies to substituents of the structural element X if it is a nonaromatic bridge of the aromatic ring Ar1 and Ar2. Any alkylene linkage (as present, for example, in a fluorene group described by the structure Ar1—X—Ar2) may likewise have any substitution. However, for steric reasons, the substituents will frequently only be substituents with low steric demands such as methyl, ethyl or propyl groups or cyclic or spirocyclic alkylene groups, or groups which, in steric terms, have a space demand corresponding to or lower than that of the groups mentioned (for example, methoxy groups). In the exceptional case, especially in the case of correspondingly projecting substituents of the A and B groups, a phenyl group may also be bonded to such an alkylene (for example, methylene) group.

The structure Ar1—X—Ar2 is especially in catenated form. In this context, "catenated" means that the two or three rings of this structural element are bonded to one another in relation to the structural elements A and B such that the A and X groups (or A and Ar2 in the case that X is a bond or a ring fused to Ar1 and Ar2) are arranged in para positions to one another. This structural relationship likewise applies to the arrangement of the B and X or B and Ar1 groups. In addition, however, further linkages may be present especially between the Ar1 and Ar2 rings, as are present, for example, anyway in the case of a ring X fused to Ar1 and Ar2.

By selection of a matrix material having a structural element K which, as becomes clear from the above remarks, has more of a planar than spherical form, it is possible to provide a material, which exhibits marked anisotropy and is therefore particularly suitable for the process according to the invention. It is essential here that the linkage of the structural elements A, K and B is catenated to some degree, which achieves the effect that the molecules are much longer in relation to the longitudinal axis running through the A, K and B groups than the extent of the molecule in the directions orthogonal to this axis, especially as far as the region of the structural element K is concerned.

The structural element K therefore may not have any spirocyclic group having more than five carbon atoms, more particularly no such group in which an alkylene group which connects the Ar1 and Ar2 rings to one another bears a spirocyclic ring as a substituent bonded directly to the alkylene group. This too can prevent the middle structural element K of the matrix material from projecting too far.

The Ar1 and Ar2 groups of the structural element K may each be a nitrogen-containing heterocycle and may comprise, for example, a biphenyl, phenanthroline, pyridine, bipyridine and/or pyrimidine derivative. In addition, independently of this, both the structural element A and the structural element B of the matrix material A-K-B may comprise an aromatically substituted amine group, especially an aromatically substituted amine group bonded directly to the structural element K. More particularly, the matrix material in this case may comprise a benzidine derivative.

Such matrix materials thus have a relatively flat central segment in the form of the benzidine group or of the phenanthroline group such that an anisotropic molecular structure can be achieved.

The structural elements A and B of the matrix material may also take such a form as to result in a particularly anisotropic molecular structure. For this purpose, sterically demanding substituents may to some extent be provided on the "ends" of a relatively elongated molecule. The structural elements A and B may therefore comprise, for example, a substituted aromatic system bearing a tertiary alkyl group (especially in the para position). If the structural elements A and B each contain a nitrogen atom bonded directly to structural element K, only one of the two terminal substituents of the nitrogen atom or else both terminal substituents may bear such a substituted aromatic group. Instead of an aromatic group substituted by a tertiary alkyl group, it is also possible for a polycyclic aryl group in which at least two aromatic rings are fused to one another to be present as a sterically demanding group. For example, naphthyl groups should be mentioned here.

The matrix material may have hole-transporting and/or electron-transporting properties. If the phosphorescent emitter emits in the violet, blue or green spectral range (i.e., particularly at a wavelength <570 nm), an electron-transporting matrix material will frequently be selected because this is generally more favorable owing to the triplet level of the matrix material and of the emitter material.

The matrix material may be selected from one or more of the following compounds or comprise at least one of the compounds mentioned:

Examples of electron transport materials include PBD (2-(4-biphenylyl)-5-(4-tert-butylphenyl)-1,3,4-oxadiazole), BCP (2,9-dimethyl-4,7-diphenyl-1,10-phenanthroline), BPhen (4,7-diphenyl-1,10-phenanthroline), TAZ (3-(4-biphenylyl)-4-phenyl-5-tert-butylphenyl-1,2,4-triazole), Bpy-OXD (1,3-bis[2-(2,2'-bipyrid-6-yl)-1,3,4-oxadiazol-5-yl]benzene), BP-OXD-Bpy (6,6'-bis[5-(biphenyl-4-yl)-1,3,4-oxadiazol-2-yl]-2,2'-bipyridyl), PADN (2-phenyl-9,10-di(naphth-2-yl)anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), and 2-NPIP (1-methyl-2-(4-(naphth-2-yl)phenyl)-1H-imidazo[4,5-f][1,10]phenanthroline) and mixtures of the aforementioned substances.

Examples of hole transport materials include NPB (N,N'-bis(naphth-1-yl)-N,N'-bis(phenyl)benzidine, β-NPB (N,N'-bis(naphth-2-yl)-N,N'-bis(phenyl)benzidine), TPD (N,N'-bis(3-methylphenyl)-N,N'-bis(phenyl)benzidine), N,N'-bis(naphth-1-yl)-N,N'-bis(phenyl)-2,2-dimethylbenzidine, DMFL-TPD (N,N'-bis(3-methylphenyl)-N,N'-bis(phenyl)-9,9-dimethylfluorene, DMFL-NPB (N,N'-bis(naphth-1-yl)-N,N'-bis(phenyl)-9,9-dimethylfluorene), DPFL-TPD (N,N'-bis(3-methylphenyl)-N,N'-bis(phenyl)-9,9-di-phenylfluorene), DPFL-NPB (N,N'-bis(naphth-1-yl)-N,N'-bis(phenyl)-9,9-diphenylfluorene), TAPC (di[4-(N,N-ditolylamino)phenyl]cyclohexane), PAPB (N,N'-bis(phenanthren-9-yl)-N,N'-bis(phenyl)benzidine), TNB (N,N,N',N'-tetranaphth-2-yl-benzidine), TiOPC (titanium oxide phthalocyanine), CuPC (copper phthalocyanine), F4-TCNQ (2,3,5,6-tetrafluoro-7,7,8,8-tetracyanoquinodimethane), PPDN (pyrazino[2,3-f]-[1,10]phenanthroline-2,3-dicarbonitrile), MeO-TPD (N,N,N',N'-tetrakis(4-methoxyphenyl)benzidine), β-NPP(N,N'-di(naphth-2-yl)-N,N'-diphenylbenzene-1,4-diamine), NTNPB (N,N'-diphenyl-N,N'-di[4-(N,N-ditolylamino)phenyl]benzidine) and NPNPB (N,N'-diphenyl-N,N'-di[4-(N,N-diphenylamino)phenyl]benzidine), 1,4-bis(2-phenylpyrimidin-5-yl)benzene (BPPyP), 1,4-bis(2-methylpyrimidin-5-yl)benzene (BMPyP), 1,4-di(1,10-phenanthrolin-3-yl)benzene (BBCP), 2,5-di(pyridin-4-yl)pyrimidine (DPyPy), 1,4-bis(2-(pyridin-4-yl)pyrimidin-5-yl)benzene (BPyPyP), 2,2',6,6'-tetraphenyl-4,4'-bipyridine (GBPy), 1,4-di(benzo[h]quinolin-3-yl)benzene (PBAPA), 2,3,5,6-tetraphenyl-4,4'-bipyridine (TPPyPy), 1,4-bis(2,3,5,6-tetraphenylpyridin-4-yl)benzene (BTPPyP), 1,4-bis(2,6-tetrapyridinylpyridin-4-yl)benzene (BDPyPyP) or mixtures of the aforementioned substances.

We further provide a radiation-emitting organic electronic device obtainable by the process described above. The device has the particular feature that increased quantum efficiencies are observed since alignment of the emitter molecules in the matrix material can block the loss channel of energy emission by plasmons.

Further organic layers may be arranged between the emitter layer of the radiation-emitting device and an electrode formed from metal in the device, especially the cathode. If the metal electrode is a cathode, at least one of the following layers is arranged between the emitter layer and the cathode: electron injection layer, electron transport layer, hole blocking layer. If the metal electrode is an anode, at least one of the following layers is arranged between anode and emitter layer: hole injection layer, hole transport layer, electron blocking layer. The distance between metal electrode and emitter layer may then be especially 50 to 200 nm, for example, 80 to 120 nm. A distance of at least 50 nm may have a tendency to additionally reduce emission via plasmons. If the layer thickness of the layers arranged between emitter layer and metal electrode becomes too thick, however, the effect achieved thereby is partly compensated for by the fact that the organic layers of the layer stack lead to energy absorptions and hence to a reduced efficiency in the case of excessive thickness.

Further advantages and advantageous examples are evident from the examples described hereinafter in conjunction with the figures.

Identical and equivalent elements and elements having the same effect are provided with the same reference numerals in the figures.

FIG. 1 shows the schematized setup of an organic radiation-emitting component.

From bottom to top, the following layer structure is implemented in FIG. 1: at the very bottom is the substrate 1. For example, a radiation-transparent substrate used is a glass substrate, for example, made from Borofloat glass, or a polymer (film) substrate, for example, made from PMMA (polymethylmethacrylate).

Atop the substrate 1 is an anode layer 2 which may, for example, consist of or comprise a transparent conductive oxide. Transparent conductive oxides ("TCO" for short) are transparent conductive materials, generally metal oxides, for example, zinc oxide, tin oxide, cadmium oxide, titanium oxide, indium oxide or indium tin oxide (ITO). As well as binary metal-oxygen compounds, for example, ZnO, $SnO_2$ or $In_2O_3$, the group of the TCOs also includes ternary metal-oxygen compounds, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Moreover, the TCOs do not necessarily correspond to a stoichiometric composition and may also be p- or n-doped. In addition, for example, a transparent anode layer 2 may also be present, this consisting of a thin metal layer (for instance, of silver) or of an alloy (for instance, AgMg), or comprising such a metal or such an alloy.

Atop the anode layer 2 is arranged a hole transport layer 4 which comprises or consists of a material which may be selected, for example, from tertiary amines, carbazole derivatives, polyaniline or polyethylenedioxythiophene. Examples include NPB, TAPC or others among the above anisotropic hole transport materials. However, non-anisotropic materials are also suitable for the hole transport layer 4. The hole transport layer is followed by the active layer in the case of an OLED, for example, an organic emitter layer 6. This emitter layer comprises or consists of the anisotropic matrix material and the anisotropic phosphorescent emitter. Atop the emitter layer is finally arranged a cathode 10, especially a metal cathode, but optionally also a cathode likewise manufactured from a transparent conductive oxide (which leads to a top/bottom emitter). For example, the cathode may consist of silver, aluminum, cadmium, barium, indium, magnesium, calcium, lithium or gold, or comprise one or more of these metals. The cathode may also be in multilayer form.

In the case of application of a voltage between anode and cathode, current flows through the component and photons are released in the organically active layer, and these also leave the component in the form of light via the transparent anode and the substrate, or in the case of a top/bottom emitter also via the transparent cathode. In one example, the OLED emits white light. In this case, the emitter layer comprises either a plurality of emitter materials emitting in various colors (for example, blue and yellow or blue, green and red). Alternatively, the emitter layer may also be formed from a plurality of component layers, in each of which one of the colors mentioned is emitted, mixing of the various colors resulting in the emission of light with a white color impression. Alternatively, a converter material may also be arranged within the beam path of the primary emission produced by these layers, this at least partly absorbing the primary radiation and emitting secondary radiation of another wavelength such that primary radiation (which is not yet white), through the combination of primary and secondary radiation, gives rise to a white color impression.

Component 1 is preferably designed for illumination, especially for general illumination, appropriately for production of visible radiation. The component can be used, for example, for interior lighting, exterior lighting or in a signaling lamp.

Figure 2:
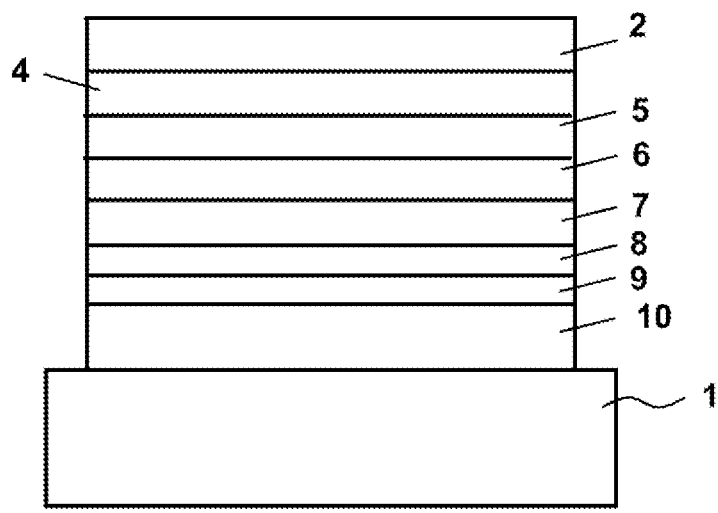

FIG. 2 shows an OLED designed as a top emitter. If the cathode 10 is transparent, this is a top/bottom emitter.

A cathode 10 (which is formed, for example, from a metal or—especially when a transparent electrode is desired—manufactured from a TCO) is arranged atop a substrate 1 (for example, a glass substrate). Atop the cathode is arranged an electron injection layer 9, atop which is an electron transport layer 8. Atop the electron transport layer 8 is a hole-blocking layer 7, atop which is then arranged the organic emitter layer 6. This emitter layer may be formed as described for FIG. 1.

Atop the emitter layer is a hole transport layer 5 which may comprise, for example, TPBi (2,2',2"-(1,3,5-benzenetriyl)tris(1-phenyl-1H-benzimidazole)) or else one of the above anisotropic electron transport materials. However, non-anisotropic materials are also suitable for the hole transport layer 5. Atop the hole transport layer is in turn a hole injection layer 4. Above the hole injection layer 4 is an anode formed, for example, from a TCO.

The organic layers can be applied by vapor deposition. For this purpose, the substrate to be coated is introduced with electrode or electrode and dielectric layer into a receptacle containing the various organic materials in various sources. For production of the individual functional layers, the organic substances are then vaporized from the respective sources and deposited on the coated surface. In addition, several sources for the supply of one or more different matrix materials are provided. For example, the emitter layer is formed using a source containing anisotropic matrix material and a source containing the phosphorescent anisotropic emitter. The further organic layers can be deposited correspondingly. In principle, mixed deposition is also possible, in which the first organic layers are applied by spin-coating and, at least from the emitter layer, the further organic layers are applied by means of vapor deposition.

Representation of an encapsulation for the organic layers has been dispensed with for reasons of clarity. Likewise for reasons of clarity, representation of any radiation emission layer present has been dispensed with. An encapsulation encapsulates the organic layer with respect to harmful outside influences such as moisture or oxygen. The encapsulation may take the form, for example, of a roof construction. Explicit representation of the electrical contact connection of the component has also been dispensed with. For example, a drive circuit for the component may be arranged on the substrate, likewise within the encapsulation.

To measure the orientation of the emitter molecules (or the dipoles relevant for the emission), the following device was produced. An ITO layer of thickness 103 nm was sputtered onto a glass substrate of thickness 0.7 mm. The organic layers which follow were applied by vapor deposition as described above. These are a hole transport layer of thickness 31 nm, an electron blocking layer of thickness 10 nm, an emitter layer composed of 92% α-NPD and 8% by weight to iridium(III) bis(dibenzo[f,h]quinoxaline)(acetylacetonate) of thickness 10 nm deposited. To establish thermodynamic conditions, the growth rate was selected at 0.05 nm/s, and a pressure of $10^{-7}$ mbar. After deposition of the emitter layer, a hole blocking layer of thickness 10 nm and an electron transport layer of thickness 65 nm were deposited. For the measurement of the emitter orientation, an OLED stack produced in this way was used without a cathode. For the measurement of efficiency, a silver cathode of thickness 200 nm was used.

To measure the orientation of the transition dipole moments, at an angle of 45°, radiation having a wavelength of 375 nm (with a cw laser) was radiated onto the side of the OLED stack remote from the substrate. On the substrate side, the radiation emitted was then detected as a function of angle. This was done by first measuring p-polarized light (TM-polarized) and, second, s-polarized light (TE-polarized). The cw laser has essentially linear-polarized light. The angle-dependent photoluminescent spectra are measured with a calibrated fiber-optic spectrometer and a polarizer to distinguish between TE- and TM-polarized emission. The measured intensities are normalized to the measurements at low angles since emission in this region originates exclusively from dipoles arranged in parallel. Incidentally, it was observed that the emission distribution is independent of the direction of incidence and the polarization of the laser radiation used for excitation.

Figure 3A:
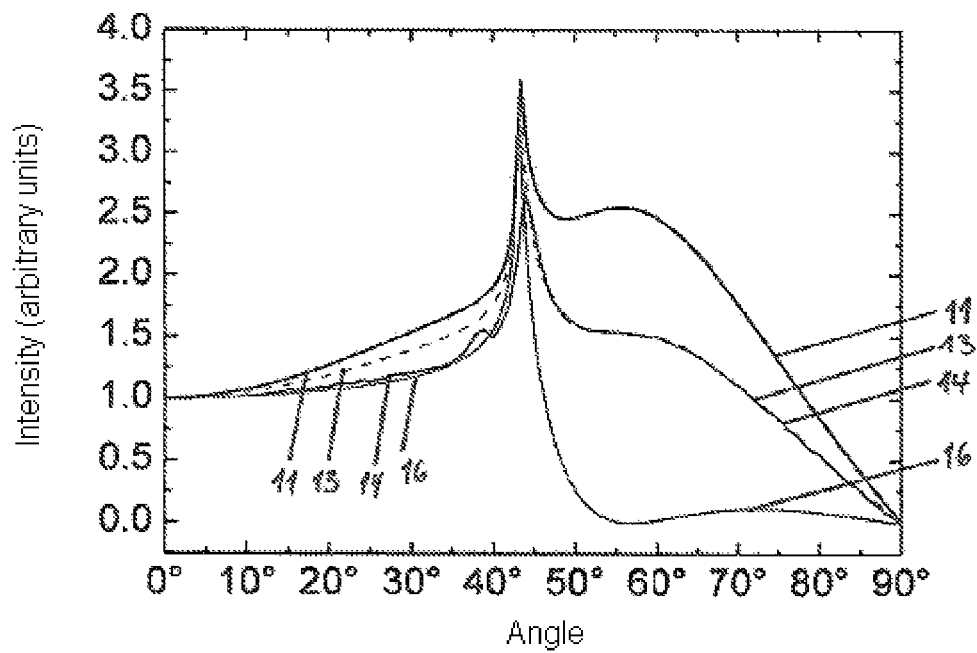
FIGS. 3A and 3B each show a measurement of the radiation intensity as a function of the polarization of the laser light used for excitation and of the emission angle.

FIG. 3A shows the relative intensity detected as a function of the emission angle for p-polarized light of wavelength 610 nm. FIG. 3A shows the simulated relative intensities for an emitter layer with completely isotropic alignment of the emitter molecules or dipoles (reference numeral 11) for a fully horizontally aligned orientation of the dipoles of the emitter molecules (reference numeral 16) and for an emitter layer in which 60% of the emitter molecules are distributed randomly and 40% horizontally aligned dipoles are present (dotted line, reference numeral 13). The actual intensity distribution measured is shown by the line with reference numeral 14. It is evident that the intensity distribution coincides with line 13, i.e. the simulated intensity distribution, particularly at angles greater than 45°.

Figure 3B:
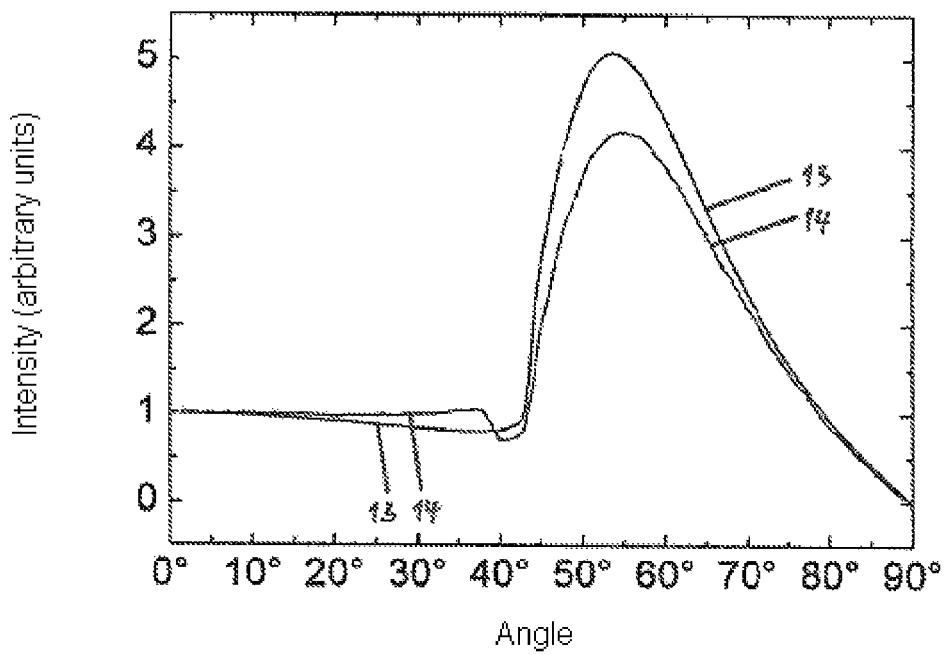

FIG. 3B shows the corresponding results if, rather than p-polarized radiation, s-polarized radiation of wavelength 610 nm is measured. Here too, good agreement of the simulated graph 13 and the actual curve measured 14 is found.

In both graphs, the simulated spectra are calculated by the specifications according to Krummacher et al., Organic Electronics 10 (2009) 478-485 and Danz et al. J. Opt. Soc. Am. B/Vol. 19, No. 3, 412-419, and the references cited in these two publications.

The best agreement between simulated and actually measured value is found for a distribution of 69.3% randomly distributed dipoles and 30.7% horizontally aligned dipoles, from which it can be calculated, on the basis of the fact that, in the case of an isotropic alignment, $\frac{2}{3}$ of the dipoles are statistically in the plane formed by the OLED layers and $\frac{1}{3}$ are aligned orthogonally thereto, that 76.9% (including the proportion of randomly aligned dipoles) of horizontal orientation of the transition dipole moments is present in the OLED according to the above-described working example.

In generalized form, it can thus be stated that our process can generally achieve a horizontal orientation of the transition dipole moments which typically exceeds 75% and, in the case of correspondingly selected anisotropic matrix materials and anisotropic phosphorescent emitters, may even have a proportion of more than 80%. It is possible that, in the case of emitter-matrix material systems particularly well-matched to one another, even values of 90% horizontal orientation are achievable.

For the device specified, the proportion of the respective loss channels has also been determined. Accordingly, the loss through waveguide effects is 10.6%, the loss through plasmons 28.2% and the loss through absorption 3%. The emission to the substrate is 33.6% and that to the air 24.6%. Thus, the efficiency can be improved by 13.9% over the isotropic case (in that case, the loss through waveguide effects is 9.6%, the loss through plasmons 36.6% and the loss through absorption 2.7%). In the case of a 100% horizontal alignment of the dipoles, it would even be possible to assume only a 10% loss through the plasmons, as a result of which an efficiency increase by 44% compared to the isotropic alignment would be recorded.

This disclosure is not restricted by the description on the basis of the working examples. Instead, our devices and methods encompass every novel feature and every combination of features, which particularly include any combination of features in the appended claims, even if the feature or combination itself is not explicitly specified in the claims or working examples.

The invention claimed is:

1. A process of producing a radiation-emitting organic electronic device having a first and a second electrode layer and an emitter layer, comprising:
   A) providing a phosphorescent emitter with an anisotropic molecular structure and a matrix material,
   B) applying the first electrode layer to a substrate,
   C) applying the emitter layer under thermodynamic control, with vaporization of the phosphorescent emitter and of the matrix material under reduced pressure and deposition thereof on the first electrode layer such that molecules of the phosphorescent emitter are in anisotropic alignment, wherein the thermodynamic control is effected by bringing the deposited emitter layer to an elevated temperature relative to room temperature of 30° C. to 100° C. by a thermal treatment during the deposition and maintaining such a temperature after the deposition step such that the emitter layer is converted to a state in which the emitter molecules can be aligned and, subsequently, cooling the emitter layer such that alignment of the emitter molecules is frozen, and
   D) applying the second electrode layer on the emitter layer.

2. The process according to claim 1, wherein the phosphorescent emitter having anisotropic molecular structure in A) is selected from the group consisting of iridium complexes, platinum complexes and palladium complexes, and mixtures thereof.

3. The process according to claim 2, wherein an iridium complex of the following formula is selected:

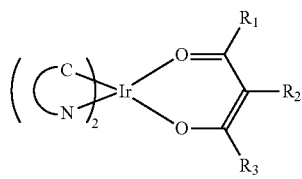

where C∩N is an at least bidentate ligand which forms a metallacyclic ring with the Ir atom, and where R1, R2 and R3 are each independently unbranched or branched alkyl radicals, fused and/or cyclic alkyl radicals and/or aryl radicals, each of which may be fully or partly substituted, and where R2 may also be H or F.

4. The process according to claim 3, wherein the ligand C∩N forms a 5-membered or 6-membered metallacyclic ring with the Ir atom.

5. The process according to claim 4, wherein the ligand C∩N is phenylpyridine, phenylimidazole, phenyloxazole, benzylpyridine, benzylimidazole, benzyloxazole or a ligand which has one of the compounds mentioned as a base skeleton.

6. The process according to claim 3, wherein the ligand C∩N has at least 3 at least partly fused aromatic rings.

7. The process according to claim 1, wherein the matrix material has an anisotropic molecular structure.

8. The process according to claim 7, wherein an A-K-B matrix material is selected, where structural element K represents an Ar1—X—Ar2 structure, Ar1 and Ar2 are identical or different aromatic rings and X is a single bond, a further aromatic group or a linkage of Ar1 and Ar2 by a fused ring,
   where the structural elements A and B are the same or different and each comprise at least one aromatic ring.

9. The process according to claim 8, wherein the Ar1 and Ar2 groups of the structural element K are each a nitrogen heterocycle and/or the structural elements A and B each comprise an aromatically substituted amine group.

10. The process according to claim 9, wherein the matrix material comprises a benzidine derivative or a phenanthroline derivative.

11. The process according to claim 8, wherein the structural elements A and B each comprise at least one aromatic system substituted by a tertiary alkyl group and/or each comprise at least one fused polycyclic aryl group.

12. The process according to claim 8, wherein the matrix material has hole-transporting and/or electron-transporting properties.

13. A radiation-emitting organic electronic device obtained by the process according to claim 1 comprising:
   a substrate,
   a first electrode layer over the substrate,
   an emitter layer over the first electrode layer, which comprises a phosphorescent emitter and a matrix material, wherein
      molecules of the phosphorescent emitter are in anisotropic alignment, and
      as the phosphorescent emitter an iridium complex of the following formula is selected:

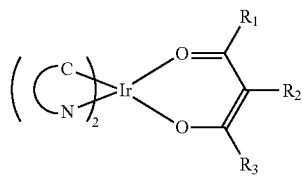

where C∩N is an at least bidentate ligand which forms a metallacyclic ring with the Ir atom, and where $R_1$, $R_2$ and $R_3$ are each independently unbranched or branched alkyl radicals, fused and/or cyclic alkyl radicals and/or aryl radicals, each of which may be fully or partly substituted, and where $R_2$ may also be H or F and wherein the ligand C∩N is phenyloxazole, benzylpyridine, benzylimidazole, benzyloxazole or a ligand which has one of the compounds mentioned as a base skeleton.

14. The device according to claim 13, wherein the first electrode layer comprises a metal electrode and a distance between the metal electrode and the emitter layer is 50 to 200 nm.

15. The device according to claim 13, wherein the first electrode layer comprises a metal electrode and a distance between the metal electrode and the emitter layer is 80 to 120 nm.

16. A process of producing a radiation-emitting organic electronic device having a first and a second electrode layer and an emitter layer, comprising:
   A) providing a phosphorescent emitter with an anisotropic molecular structure and a matrix material,
   B) applying the first electrode layer to a substrate,
   C) applying the emitter layer under thermodynamic control, with vaporization of the phosphorescent emitter and of the matrix material under reduced pressure and deposition thereof on the first electrode layer, such that molecules of the phosphorescent emitter are in anisotropic alignment, wherein the thermodynamic control is effected by bringing the deposited emitter layer to an elevated temperature relative to room temperature of 30° C. to 100° C. by a thermal treatment during the deposition and maintaining such a temperature after the deposition step and, subsequently, cooling the emitter layer, and
   D) applying the second electrode layer on the emitter layer.

* * * * *